(12) United States Patent
Park et al.

(10) Patent No.: US 11,862,086 B2
(45) Date of Patent: Jan. 2, 2024

(54) PIXEL CIRCUIT AND DISPLAY DEVICE INCLUDING THE SAME

(71) Applicant: LG Display Co., Ltd., Seoul (KR)

(72) Inventors: Jae Hoon Park, Paju-si (KR); Jae Sung Yu, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/858,904

(22) Filed: Jul. 6, 2022

(65) Prior Publication Data

US 2023/0010212 A1  Jan. 12, 2023

(30) Foreign Application Priority Data

Jul. 8, 2021 (KR) .................. 10-2021-0090018
Dec. 2, 2021 (KR) .................. 10-2021-0170674

(51) Int. Cl.
*G09G 3/3233* (2016.01)
*H10K 59/124* (2023.01)
*G09G 3/20* (2006.01)

(52) U.S. Cl.
CPC ......... *G09G 3/3233* (2013.01); *H10K 59/124* (2023.02); *G09G 3/2007* (2013.01); (Continued)

(58) Field of Classification Search
CPC ............... G09G 3/3233; G09G 3/2007; G09G 2300/0426; G09G 2300/0819; G09G 2300/0842; G09G 2300/0861; G09G 2310/0286; G09G 2310/0294; G09G 2310/08; G09G 2320/0238;
(Continued)

(56) References Cited

U.S. PATENT DOCUMENTS 7,306,981 B2  12/2007 Kuwabara et al.
8,570,257 B2  10/2013 Yamashita et al.
(Continued)

FOREIGN PATENT DOCUMENTS

CN  108630141 A  10/2018
EP  3748623 A1  12/2020
(Continued)

OTHER PUBLICATIONS

Office Action, dated May 30, 2023, for Japanese Patent Application No. 2022-098225. (8 pages) (with English Translation).

*Primary Examiner* — Jeff Piziali
(74) *Attorney, Agent, or Firm* — Seed IP Law Group LLP

(57) ABSTRACT

A pixel circuit and a display device including the same are disclosed. The pixel circuit includes a driving element including a first electrode connected to a first node, a first gate electrode connected to a second node, a second electrode connected to a third node, and a second gate electrode to which a preset voltage is applied; a light emitting element including an anode electrode connected to a fourth node and a cathode electrode to which a low-potential power supply voltage is applied; a first switch element connected between the first node and the second node; a second switch element connected between the third node and the fourth node; a first capacitor connected to the first gate electrode of the driving element; and a second capacitor connected to the third node.

15 Claims, 13 Drawing Sheets

(52) U.S. Cl.
CPC ............. *G09G 2300/0426* (2013.01); *G09G 2300/0819* (2013.01); *G09G 2300/0842* (2013.01); *G09G 2300/0861* (2013.01); *G09G 2310/0286* (2013.01); *G09G 2310/0294* (2013.01); *G09G 2310/08* (2013.01); *G09G 2320/0238* (2013.01); *G09G 2320/0247* (2013.01); *G09G 2320/0626* (2013.01)

(58) Field of Classification Search
CPC ... G09G 2320/0247; G09G 2320/0626; G09G 2300/0814; G09G 2300/0866; G09G 2320/045; G09G 2330/021; H10K 59/124
See application file for complete search history.

(56) References Cited

U.S. PATENT DOCUMENTS

| | | | |
|---|---|---|---|
| 10,565,932 B2 | 2/2020 | Zhang | |
| 2007/0236430 A1* | 10/2007 | Fish | G09G 3/3233 345/82 |
| 2011/0273419 A1* | 11/2011 | Park | G09G 3/3233 345/76 |
| 2015/0171156 A1* | 6/2015 | Miyake | H01L 27/1225 257/43 |
| 2016/0189654 A1* | 6/2016 | Kim | G09G 3/3685 345/88 |
| 2017/0061878 A1 | 3/2017 | Park et al. | |
| 2017/0337875 A1* | 11/2017 | Jeon | G09G 3/3291 |
| 2019/0066587 A1* | 2/2019 | Han | G09G 3/3258 |
| 2019/0362674 A1* | 11/2019 | Xu | G09G 3/3241 |
| 2020/0226978 A1 | 7/2020 | Lin et al. | |
| 2020/0243008 A1 | 7/2020 | Lee et al. | |
| 2021/0065648 A1* | 3/2021 | Choi | G09G 3/3696 |
| 2021/0158752 A1* | 5/2021 | Kang | G09G 3/3291 |
| 2022/0366849 A1* | 11/2022 | Lee | G09G 3/3233 |

FOREIGN PATENT DOCUMENTS

| | | |
|---|---|---|
| JP | 2003152191 A | 5/2003 |
| JP | 2011118301 A | 6/2011 |
| JP | 2020112795 A | 7/2020 |
| KR | 2006/0083101 A1 | 7/2006 |
| KR | 2019/0072200 A | 6/2019 |
| KR | 2020/0071433 A | 6/2020 |

* cited by examiner

—— Waveform after change with time
—— Waveform after voltage adjustment

PIXEL CIRCUIT AND DISPLAY DEVICE INCLUDING THE SAME

CROSS-REFERENCE TO RELATED APPLICATION

This application claims priority to and the benefit of Korean Patent Application No. 10-2021-0090018, filed Jul. 8, 2021, and Korean Patent Application No. 10-2021-0170674, filed Dec. 2, 2021, the disclosure of which is incorporated herein by reference in its entirety.

BACKGROUND

Technical Field

The present disclosure relates to a pixel circuit and a display device including the same.

Description of the Related Art

Electroluminescent display devices are roughly classified into inorganic light emitting display devices and organic light emitting display devices depending on the material of the emission layer. The organic light emitting display device of an active matrix type includes an organic light emitting diode (hereinafter, referred to as "OLED") that emits light by itself, and has an advantage in that the response speed is fast and the luminous efficiency, luminance, and viewing angle are large. In the organic light emitting display device, the OLED is formed in each pixel. The organic light emitting display device not only has a fast response speed, excellent luminous efficiency, luminance, and viewing angle, but also has excellent contrast ratio and color reproducibility since it can express black gray scales in complete black.

A pixel circuit of the electroluminescent display device includes the OLED used as a light emitting element and a driving element for driving the OLED. Electrical characteristics of the driving element may be changed due to deterioration of the driving element. In this case, because the quality of an image reproduced on a screen is lowered, it is necessary to compensate for the electrical characteristics of the driving element.

BRIEF SUMMARY

The inventors have realized that, when a threshold voltage of the driving element is shifted, it is difficult to sense the threshold voltage of the driving element when a shift range exceeds a voltage capable of sensing.

For example, when the driving element is implemented as a transistor including an oxide semiconductor, if the threshold voltage of the transistor is near 0V, it is difficult to compensate for the shift in the threshold voltage of the driving element.

When a driving frequency of the display device increases or a resolution of the display device increases, one horizontal period becomes smaller. In this case, compensation performance is deteriorated because the time for sensing and sampling the threshold voltage of the driving element is insufficient, thus making it difficult to implement the luminance of black gray scales.

Embodiments of the present disclosure solve the above-mentioned needs and/or problems. The present disclosure provides a pixel circuit capable of accurately sampling a threshold voltage of a driving element, and also provides a display device including the same.

The problems to be solved by the present disclosure are not limited to those mentioned above, and other problems not mentioned will be clearly understood by those skilled in the art from the following description.

A pixel circuit according to an embodiment of the present disclosure includes a driving element including a first electrode connected to a first node, a first gate electrode connected to a second node, a second electrode connected to a third node, and a second gate electrode to which an initialization voltage is applied; a light emitting element including an anode electrode connected to a fourth node and a cathode electrode to which a low-potential power supply voltage is applied, the light emitting element being driven according to a current from the driving element; a first switch element connected between the first node and the second node; a second switch element connected between the third node and the fourth node; a first capacitor connected to the first gate electrode of the driving element and to which a data voltage of pixel data is applied; and a second capacitor connected to the third node and to which the initialization voltage is applied.

A display device according to an embodiment of the present disclosure includes a display panel in which a plurality of data lines, a plurality of gate lines intersected with the data lines, a first power line to which a pixel driving voltage is applied, a second power line to which an initialization voltage is applied, a third power line to which a reference voltage is applied, a fourth power line to which a low-potential power supply voltage is applied, and a plurality of pixel circuits connected to the data lines, the gate lines, and the first, second, third and fourth power lines are disposed; a data driver supplying a data voltage of pixel data to the data lines; and a gate driver supplying a gate signal to the gate lines. The display device further includes a data driver that, in operation, supplies a data voltage of pixel data to the data lines. The display device further includes a gate driver that, in operation, supplies a gate signal to the gate lines.

In one embodiment, a display device includes a display panel, a data driver, and a gate driver. The display panel includes: a plurality of pixel circuits; a plurality of data lines connected to the plurality of pixel circuits; and a plurality of gate lines connected to the plurality of pixel circuits. The data driver, in operation, supplies a data voltage to the plurality of data lines. The gate driver, in operation, supplies a gate signal to the plurality of gate lines. Each of the pixel circuits includes: a driving element including a first electrode connected to a first node, and a gate electrode connected to a second node, a second electrode connected to a third node; a light emitting element including an anode electrode connected to a fourth node and a cathode electrode to which a low-potential power supply voltage is applied, the light emitting element being driven according to a current from the driving element; a first switch element connected between the first node and the second node; a second switch element connected between the third node and the fourth node; and a capacitor connected to the first gate electrode of the driving element and to which the initialization voltage is applied.

The present disclosure can shift the threshold voltage of the driving element to a voltage range capable of sensing by applying a preset or initialization voltage to the second gate electrode of the driving element in an internal compensation circuit using a diode connection circuit. As a result, by shifting the threshold voltage of the driving element that has been shifted to a voltage of 0 Volts or less to a higher voltage capable of being sensed, the present disclosure can sense the threshold voltage of the driving element and compensate for the threshold voltage of the driving element.

The present disclosure can reduce power consumption by using an oxide TFT whose threshold voltage is shifted to a voltage of 0 Volts or less as the driving element of the pixel circuit, improve the reliability of the display panel, and ensure the reliability of the elements constituting the pixel circuit.

By separating the sampling step and the addressing step in the pixel circuit to which the internal compensation circuit is applied, the present disclosure can ensure a sufficient time beneficial for sampling the threshold voltage of the driving element, solve the problems of realization of black luminance and deterioration of compensation performance, allow high-speed driving of the display device, and improve the image quality in high-resolution and high-speed driving display device.

The present disclosure can optimize or improve the thickness of the insulating layer and thereby increase the influence of the voltage inducing the threshold voltage shift of the driving element.

The present disclosure can implement a flicker-free image quality by including the anode reset frame in the low-speed driving mode.

The present disclosure can include the reset step prior to the initialization step to reset the pixel circuit in the previous frame, thereby preventing a change in the voltage applied to the pixel circuit in the current frame.

The present disclosure can offset, by changing the gate voltage or data voltage, a phenomenon that the kickback voltage generated during turn-off of the switch element switching a diode connection in the pixel circuit increases according to the threshold voltage that increases depending on the accumulated driving time of the switch element, and thereby reduce a temporal error of sampling the threshold voltage of the driving element.

The effects of the present disclosure are not limited to the above-mentioned effects, and other effects that are not mentioned will be apparently understood by those skilled in the art from the following description and the appended claims.

BRIEF DESCRIPTION OF THE SEVERAL VIEWS OF THE DRAWINGS

The above and other objects, features, and advantages of the present disclosure will become more apparent to those of ordinary skill in the art by describing embodiments thereof in detail with reference to the attached drawings, in which.

DETAILED DESCRIPTION

Figure 1A:
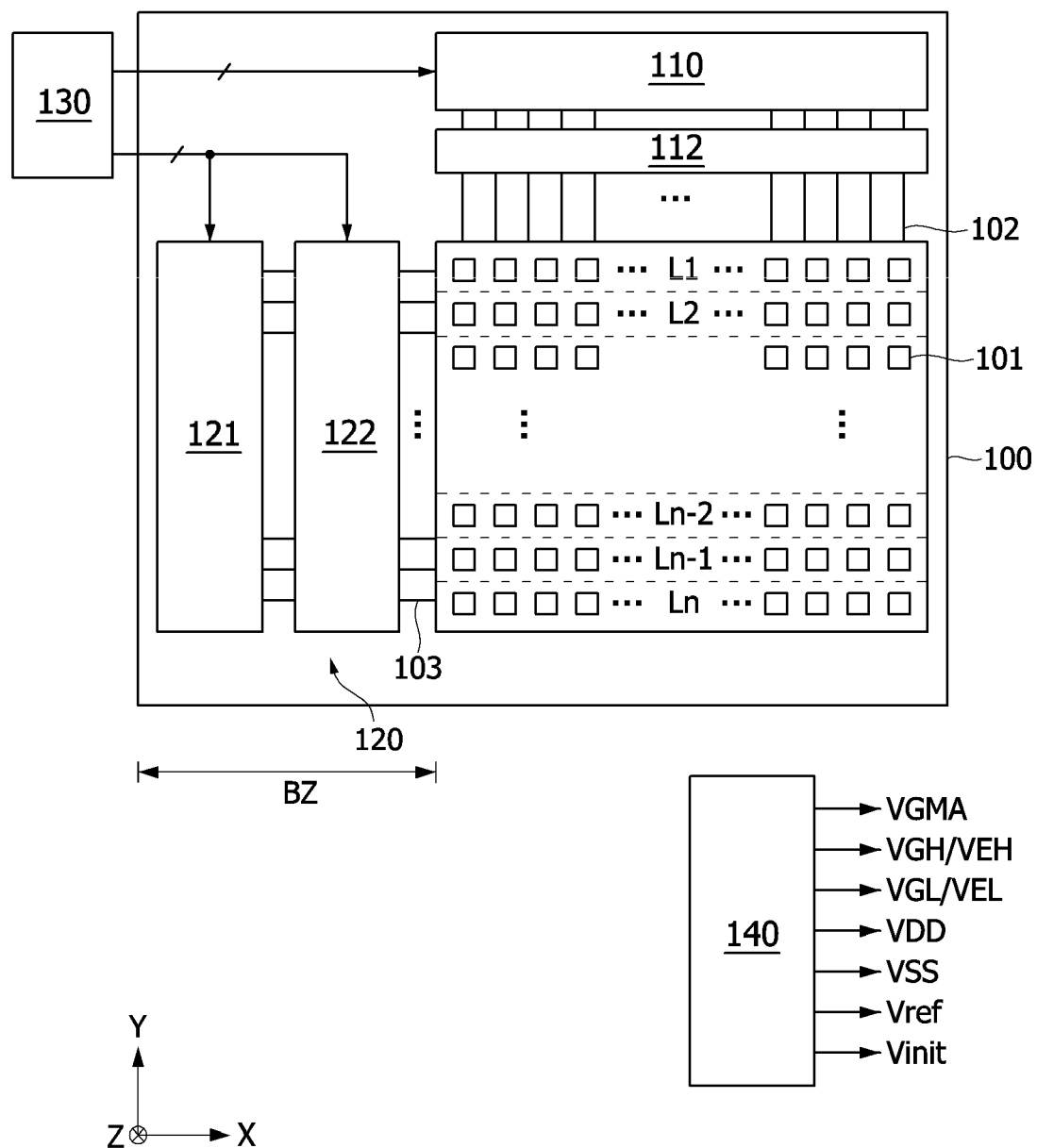
FIG. 1A is a block diagram illustrating a display device according to one embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The same reference numerals may refer to substantially the same elements throughout the present disclosure.

The following embodiments can be partially or entirely bonded to or combined with each other and can be linked and operated in technically various ways. The embodiments can be carried out independently of or in association with each other.

Each of the pixels may include a plurality of sub-pixels having different colors in order to reproduce the color of the image on a screen of the display panel. Each of the sub-pixels includes a transistor used as a switch element or a driving element. Such a transistor may be implemented as a TFT (Thin Film Transistor).

A driving circuit of the display device writes a pixel data of an input image to pixels on the display panel. To this end, the driving circuit of the display device may include a data driving circuit configured to supply data signals to the data lines, a gate driving circuit configured to supply a gate signal to the gate lines, and the like.

In a display device of the present disclosure, the pixel circuit and the gate driving circuit may include a plurality of transistors. Transistors may be implemented as oxide thin film transistors (oxide TFTs) including an oxide semiconductor, low temperature polysilicon (LTPS) TFTs including low temperature polysilicon, or the like. In embodiments, descriptions will be given based on an example in which the transistors of the pixel circuit and the gate driving circuit are implemented as the n-channel oxide TFTs, but the present disclosure is not limited thereto.

Generally, a transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (p-channel metal-oxide semiconductor (PMOS)), since carriers are holes, a source voltage is higher than a drain voltage such that holes may flow from a source to a drain. In the p-channel transistor, since holes flow from the source to the drain, a current flows from the source to the drain. It should be noted that a source and a drain of a transistor are not fixed. For example, a source and a drain may be changed according to an applied voltage. Therefore, the disclosure is not limited due to a source and a drain of a transistor. In the following description, a source and a drain of a transistor will be referred to as a first electrode and a second electrode.

A gate signal swings between a gate-on voltage and a gate-off voltage. The gate-on voltage is set to a voltage higher than a threshold voltage of a transistor, and the gate-off voltage is set to a voltage lower than the threshold voltage of the transistor.

The transistor is turned on in response to the gate-on voltage and is turned off in response to the gate-off voltage. In the case of an n-channel transistor, a gate-on voltage may be a gate high voltage VGH and VEH, and a gate-off voltage may be a gate low voltage VGL and VEL. The gate-on voltages VGH, VEH may be the same or different from each other, and the gate-off voltages VGL, VEL may be the same or different from each other.

Hereinafter, various embodiments of the present disclosure will be described in detail with reference to the accompanying drawings. In the following embodiments, a display device will be described focusing on an organic light emitting display device, but the present disclosure is not limited thereto.

Figure 1B:
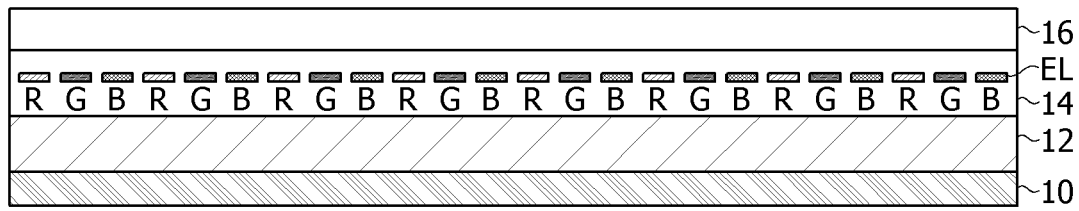
FIG. 1B is a cross-sectional diagram illustrating a cross-sectional structure of the display panel shown in FIG. 1A.
Figure 1B:
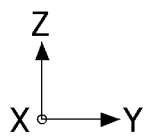

Referring to FIGS. 1A and 1B, a display device according to an embodiment of the present disclosure includes a display panel 100, a display panel driver for writing pixel data to pixels of the display panel 100, and a power supply 140 for generating power beneficial for driving the pixels and the display panel driver.

Figure 5:
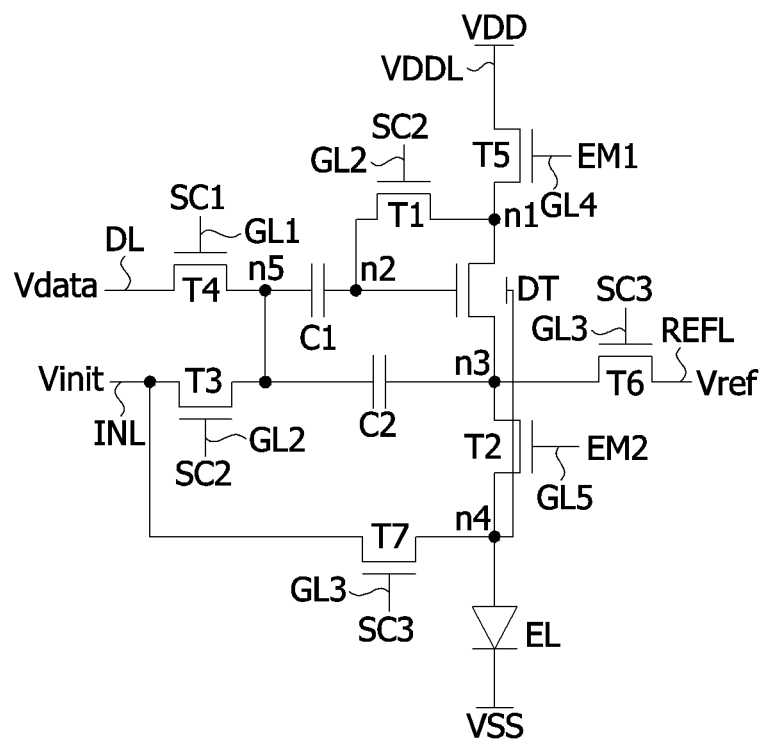
FIG. 5 is a circuit diagram illustrating a pixel circuit according to another embodiment of the present disclosure.

The display panel 100 may be a display panel of a rectangular structure having a length in the X-axis direction, a width in the Y-axis direction, and a thickness in the Z-axis direction. The display panel 100 includes a pixel array that displays an input image on a screen. The pixel array includes a plurality of data lines 102, a plurality of gate lines 103 intersected with the data lines 102, and pixels arranged in a matrix form. The display panel 100 may further include power lines commonly connected to the pixels. In FIG. 5, the power lines may include a first power line VDDL to which a pixel driving voltage VDD is applied, a second power line INL to which an initialization voltage Vinit is applied, and a third power line REFL to which a reference voltage Vref is applied. The display panel 100 may further include a fourth power line to which a low-potential power supply voltage VSS is applied.

The cross-sectional structure of the display panel 100 may include a circuit layer 12, a light emitting element layer 14, and an encapsulation layer 16 stacked on a substrate 10 as shown in FIG. 1B.

The circuit layer 12 may include a TFT array including a pixel circuit connected to wirings such as a data line, a gate line, and a power line, a de-multiplexer array 112, a gate driver 120, and the like. The wirings and circuit elements of the circuit layer 12 may include a plurality of insulating layers, two or more metal layers separated with the insulating layer therebetween, and an active layer having a semiconductor material. All transistors formed in the circuit layer 12 may be implemented as n-channel oxide TFTs.

The light emitting element layer 14 may include a light emitting element EL driven by a pixel circuit. The light emitting element EL may include a red (R) light emitting element, a green (G) light emitting element, and a blue (B) light emitting element. In another embodiment, the light emitting element layer 14 may include a white light emitting element and a color filter. The light emitting elements EL of the light emitting element layer 14 may be covered by a protective layer including an organic film and a passivation film.

The encapsulation layer 16 covers the light emitting element layer 14 to seal the circuit layer 12 and the light emitting element layer 14. The encapsulation layer 16 may have a multilayered insulating structure in which an organic film and an inorganic film are alternately stacked. The inorganic film blocks the penetration of moisture and oxygen. The organic film planarizes the surface of the inorganic film. When the organic film and the inorganic film are stacked in multiple layers, a movement path of moisture or oxygen becomes longer compared to a single layer, so that penetration of moisture and oxygen affecting the light emitting element layer 14 can be effectively blocked.

A touch sensor layer (not shown) may be formed on the encapsulation layer 16, and a polarizing plate or a color filter layer may be disposed thereon. The touch sensor layer may include capacitive type touch sensors that sense a touch input based on a change in capacitance before and after the touch input. The touch sensor layer may include metal wiring patterns and insulating layers forming the capacitance of the touch sensors. The insulating layers may insulate a portion where the metal wiring patterns are intersected, and may planarize the surface of the touch sensor layer. The polarizing plate may improve visibility and contrast ratio by converting the polarization of external light reflected by metal of the touch sensor layer and the circuit layer. The polarizing plate may be implemented as a polarizing plate in which a linear polarizing plate and a phase delay film are bonded, or a circular polarizing plate. A cover glass may be adhered to the polarizing plate. The color filter layer may include red, green, and blue color filters. The color filter layer may further include a black matrix pattern. The color filter layer may replace the polarizing plate by absorbing a part of the wavelength of light reflected from the circuit layer and the touch sensor layer, and increase the color purity of an image reproduced in the pixel array.

The pixel array includes a plurality of pixel lines L1 to Ln. Each of the pixel lines L1 to Ln includes one line of pixels arranged along a line direction X in the pixel array of the display panel 100. Pixels arranged in one pixel line share the gate lines 103. Sub-pixels arranged in a column direction Y along a data line direction share the same data line 102. One horizontal period 1H is a time obtained by dividing one frame period by the total number of pixel lines L1 to Ln.

The display panel 100 may be implemented as a non-transmissive display panel or a transmissive display panel. The transmissive display panel may be applied to a transparent display device in which an image is displayed on a screen and an actual background is visible.

The display panel may be manufactured as a flexible display panel. The flexible display panel may be implemented as an OLED panel using a plastic substrate. A pixel array and a light emitting device of the plastic OLED panel may be disposed on an organic thin film adhered to a back plate.

The organic thin film may be disposed on the back plate of the plastic OLED panel. A pixel circuit and a light emitting device may be stacked on the organic thin film, and a touch sensor array may be formed thereon. The back plate blocks the moisture permeation towards the organic thin film so that the pixel array is not exposed to humidity. The organic thin film may be a thin polyimide (PI) film substrate. A multi-layered buffer film may be formed of an insulating material (not shown) on the organic thin film. Lines of the pixel array may be formed on the organic thin film so as to supply power or signals applied to the pixel circuit and the touch sensor array.

Each of the pixels 101 may be divided into a red sub-pixel, a green sub-pixel, and a blue sub-pixel to implement color. Each of the pixels may further include a white sub-pixel. Each of the sub-pixels includes a pixel circuit. Hereinafter, a pixel may be interpreted as having the same meaning as a sub-pixel. Each pixel circuit is connected to the data lines, the gate lines, and the power lines.

The pixels may be arranged as real color pixels and pentile pixels. The pentile pixel may realize a higher resolution than the real color pixel by driving two sub-pixels having different colors as one pixel 101 through a preset or selected pixel rendering algorithm. The pixel rendering algorithm may compensate for insufficient color representation in each pixel with the color of light emitted from an adjacent pixel.

Touch sensors may be disposed on the display panel 100. A touch input may be sensed using separate touch sensors or may be sensed through pixels. The touch sensors may be disposed as an on-cell type or an add-on type on the screen of the display panel or implemented as in-cell type touch sensors embedded in the pixel array.

The power supply 140 generates direct current (DC) power beneficial for driving the pixel array and the display panel driver of the display panel 100 by using a DC-DC converter. The DC-DC converter may include a charge pump, a regulator, a buck converter, a boost converter, and the like. The power supply 140 may adjust the level of a DC input voltage applied from a host system (not shown) and thereby generate DC voltages such as a gamma reference voltage VGMA, gate-on voltages VGH and VEH, gate-off voltages VGL and VEL, pixel driving voltage VDD, a low-potential power supply voltage VSS, a reference voltage Vref, and an initialization voltage Vinit. The gamma reference voltage VGMA is supplied to a data driver 110. The gate-on voltages VGH and VEH and the gate-off voltages VGL and VEL are supplied to a gate driver 120. The pixel driving voltage VDD, the low-potential power supply voltage VSS, the reference voltage Vref, and the initialization voltage Vinit are commonly supplied to the pixels. The reference voltage Vref and the initialization voltage Vinit may be generated from the data driver 110.

The display panel driver writes pixel data of an input image to the pixels of the display panel 100 under the control of a timing controller (TCON) 130.

The display panel driver includes the data driver 110 and the gate driver 120. The display panel driver may further include a de-multiplexer array 112 disposed between the data driver 110 and the data lines 102.

The de-multiplexer array 112 sequentially connects channels of the data driver 110 to the data lines 102 by using a plurality of de-multiplexers (DEMUX) to transfer the data voltage output from the data driver 110 to the data lines 102. The de-multiplexer array 112 may include a plurality of switch elements disposed on the display panel 100. When the de-multiplexer array 112 is disposed between output terminals of the data driver 110 and the data lines 102, the number of channels of the data driver 110 may be reduced. The de-multiplexer array 112 may be omitted.

The display panel driver may further include a touch sensor driver for driving the touch sensors. The touch sensor driver is omitted from FIG. 1A. The data driver and the touch sensor driver may be integrated into one drive integrated circuit (IC). In a mobile device or a wearable device, the timing controller 130, the power supply 140, the data driver 110, and the like may be integrated into one drive IC.

The display panel driver may operate in a low-speed driving mode under the control of the timing controller 130. The low-speed driving mode may be set to reduce power consumption of the display device when the input image does not change by a preset or selected number of frames under analysis of the input image. In the low-speed driving mode, the power consumption of the display panel driver and the display panel 100 may be reduced by lowering a refresh rate of the pixels when still images are inputted for a predetermined or selected time or longer. The low-speed driving mode is not limited to a case where still images are inputted. For example, when the display device operates in a standby mode or when a user command or an input image is not inputted to a display panel driving circuit for a predetermined or selected time or longer, a display panel driving circuit may operate in the low-speed driving mode.

The data driver 110 generates a data voltage by converting pixel data of an input image received as a digital signal from the timing controller 130 with a gamma compensation voltage every frame period by using a digital to analog converter (DAC). The gamma reference voltage VGMA is divided into gamma compensation voltages for respective gray scales through a voltage divider circuit. The gamma compensation voltage for each gray scale is provided to the DAC of the data driver 110. The data voltage is outputted through an output buffer in each of the channels of the data driver 110.

The gate driver 120 may be implemented as a gate in panel (GIP) circuit directly formed on the display panel 100 together with a TFT array and wirings of the pixel array. The GIP circuit may be disposed in a bezel (BZ) area, which is a non-display area, of the display panel 100 or may be dispersedly disposed in the pixel array in which an input image is reproduced. The gate driver 120 sequentially outputs gate signals to the gate lines 103 under the control of the timing controller 130. The gate driver 120 may sequentially supply the gate signals to the gate lines 103 by shifting the gate signals using a shift register. The gate signal may include a scan signal and a light emission control signal (hereinafter, referred to as an "EM signal") in the organic light emitting diode display. The scan signal includes a scan pulse swinging between the gate-on voltage VGH and the gate-off voltage VGL. The EM signal may include an emission control (EM) pulse swinging between the gate-on voltage VEH and the gate-off voltage VEL.

The scan pulse is synchronized with the data voltage to select pixels of a line to which data is to be written. The EM signal defines or controls the emission time of the pixels. For example, the pixels may begin emitting light at a rising edge of the EM signal, and may cease emitting light at a falling edge of the EM signal.

The gate driver 120 may include a first gate driver 121 and a second gate driver 122. The first gate driver 121 outputs the scan pulse in response to a start pulse and a shift clock from the timing controller 130, and shifts the scan pulse according to the shift clock timing. The second gate driver 122 outputs the EM pulse in response to the start pulse and the shift clock from the timing controller 130, and sequentially shifts the EM pulse according to the shift clock.

The timing controller 130 receives digital video data DATA of an input image, and a timing signal synchronized therewith, from the host system. The timing signal may include a vertical synchronization signal Vsync, a horizontal synchronization signal Hsync, a clock CLK, a data enable signal DE, and the like. Because a vertical period and a horizontal period can be known by counting the data enable signal DE, the vertical synchronization signal Vsync and the horizontal synchronization signal Hsync may be omitted. The data enable signal DE has a cycle of one horizontal period (1H).

The host system may be one of a television (TV) system, a tablet computer, a notebook computer, a navigation system, a personal computer (PC), a home theater system, a mobile device, a wearable device, and a vehicle system. The host system may scale an image signal from a video source to fit the resolution of the display panel 100 and transmit it to the timing controller 130 together with the timing signal.

The timing controller 130 lowers a frame rate (or frequency) at which pixel data is written to pixels in the low-speed driving mode compared to the normal driving mode. For example, a data refresh frame in which pixel data is written to pixels in the normal driving mode may occur at a frequency of 60 Hz or higher, for example, at any one refresh rate of 60 Hz, 120 Hz, and 144 Hz, and the data refresh frame (DRF) in the low-speed driving mode may occur at a refresh rate of a lower frequency than that of the normal driving mode. In order to lower the refresh rate of pixels in the low-speed driving mode, the timing controller 130 may lower the frame frequency to a frequency between 1 Hz and 30 Hz and thereby lower the driving frequency of the display panel driver.

Based on the timing signals Vsync, Hsync, and DE received from the host system, the timing controller 130 generates a data timing control signal for controlling the operation timing of the data driver 110, MUX signals MUX1 and MUX2 for controlling the operation timing of the de-multiplexer array 112, and a gate timing control signal for controlling the operation timing of the gate driver 120. Controlling the operation timing of the display panel driver, the timing controller 130 synchronizes the data driver 110, the de-multiplexer array 112, the touch sensor driver, and the gate driver 120.

The gate timing control signal outputted from the timing controller 130 may be inputted to the gate driver 120 through a level shifter (not shown). The level shifter may receive the gate timing control signal, generate a start signal and a shift clock swinging between the gate-on voltages VGH and VEH and the gate-off voltages VGL and VEL, and supply them to the gate driver 120.

The timing controller 130 may control the power supply 140 to vary the output voltage of the power supply 140 according to the accumulated driving time of the pixels 101. For example, based on the result of measuring a reliability characteristic of positive bias temperature stress (PBTS) for transistors constituting the pixel circuit before product shipment, the shift amount of the threshold voltage Vth according to the accumulated driving time of the pixels may be derived. The timing controller 130 may have a look-up table (LUT) in which the shift amount of the threshold voltage according to the accumulated driving time of the switch element and corresponding voltage compensation values are preset or selected. The timing controller 130 may provide a voltage compensation value for compensating for the shift amount of the threshold voltage according to the accumulated driving time of the pixels to the power supply 140, based on data stored in the look-up table. In this case, the power supply 140 may change at least one of the gamma reference voltage VGMA, the gate-on voltages VGH and VEH, and the gate-off voltages VGL and VEL according to the voltage compensation value from the timing controller 130. The data voltage Vdata outputted from the data driver 110 may be changed according to the gamma reference voltage VGMA. The voltages of the scan pulse and the EM pulse outputted from the gate driver 120 may be changed according to the gate-on voltages VGH and VEH and the gate-off voltages VGL and VEL.

Due to device characteristic deviations and process deviations caused in the manufacturing process of the display panel 100, there may be differences in electrical characteristics of the driving element among pixels, and such differences may increase as driving time of the pixels elapses. In order to compensate for differences in electrical characteristics of the driving element among pixels, an internal compensation technique or an external compensation technique may be applied to the organic light emitting diode display. The internal compensation technique samples a threshold voltage of the driving element for each sub-pixel by using an internal compensation circuit implemented in each pixel circuit and compensates the gate-source voltage (Vgs) of the driving element by the threshold voltage. The external compensation technique senses in real time a current or voltage of the driving element that varies according to electrical characteristics of the driving element by using an external compensation circuit. The external compensation technique compensates for the deviation (or variation) of the electrical characteristics of the driving element in each pixel in real time by modulating the pixel data (digital data) of the input image by the electrical characteristic deviation (or variation) of the driving element sensed for each pixel. Using the external compensation technique and/or the internal compensation technique, the display panel driver may drive the pixels. The pixel circuit may be implemented as a circuit to which the internal compensation circuit is applied, for example, the circuits shown in FIGS. 5 to 10.

Figure 2:
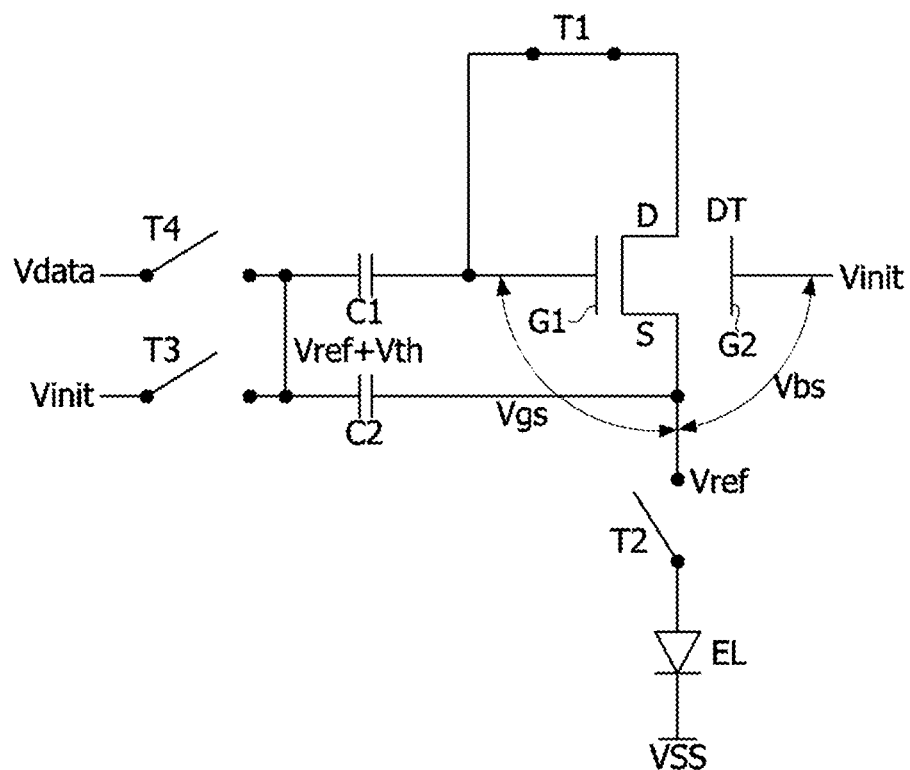
FIG. 2 is a circuit diagram illustrating a pixel circuit according to one embodiment of the present disclosure.

FIG. 2 is a circuit diagram illustrating a pixel circuit according to one embodiment of the present disclosure.

Referring to FIG. 2, the pixel circuit includes a light emitting element EL, a driving element DT for driving the light emitting element EL, a first switch element T1 connected between a first gate electrode G1 and a first electrode D of the driving element DT, and a second switch element T2 connected between a second electrode S of the driving element DT and the light emitting element EL. The driving element DT and the switch elements T1 and T2 may be implemented as n-channel oxide TFTs.

The light emitting element EL may be implemented as an OLED. The OLED includes an organic compound layer formed between an anode electrode and a cathode electrode. The organic compound layer may include, but is not limited to, a hole injection layer (HIL), a hole transport layer (HTL), an emission layer (EML), an electron transport layer (ETL), and an electron injection layer (EIL). When a voltage is applied to the anode and cathode electrodes of the OLED, holes passing through the hole transport layer (HTL) and electrons passing through the electron transport layer (ETL) are moved to the emitting layer (EML) to form exciton, and thus visible light is emitted from the emitting layer (EML). The OLED used as the light emitting element EL may have a tandem structure in which a plurality of emitting layers are stacked. The OLED of the tandem structure can improve the luminance and lifespan of pixels.

The driving element DT may be a MOSFET with a double gate structure including a first gate electrode G1 and a second gate electrode G2. The second gate electrode G2 may be a body electrode or bottom gate electrode. The first gate electrode G1 and the second gate electrode G2 may overlap each other with a semiconductor active pattern therebetween. A predetermined or selected voltage, for example, an initialization voltage Vinit to be described later, may be applied to the second gate electrode G2.

A voltage Vbs between the second gate electrode G2 of the driving element DT and the second electrode of the driving element may shift the threshold voltage of the driving element DT to a desired voltage. The first electrode may be a drain electrode, and the second electrode may be a source electrode. Hereinafter, the voltage between the second gate electrode G2 of the driving element DT and the second electrode of the driving element is abbreviated as "Vbs."

The first switch element T1 includes a first electrode connected to the first electrode D of the driving element DT, a second electrode connected to the first gate electrode G1 of the driving element DT, and a gate electrode to which a scan pulse is applied. The first switch element T1 is turned on in response to the gate-on voltage VGH of the scan pulse and is turned off according to the gate-off voltage VGL of the scan pulse. When the first switch element T1 is turned on, the driving element DT operates as a diode because the first gate electrode G1 and the first electrode are connected. When the first switch element T1 is turned off, the first gate electrode G1 and the first electrode D of the driving element DT are separated.

The second switch element T2 includes a first electrode connected to the second electrode S of the driving element DT, a second electrode connected to the anode electrode of the light emitting element EL, and a gate electrode to which an EM pulse is applied. The second switch element T2 is turned on in response to the gate-on voltage VEH of the EM pulse and is turned off according to the gate-off voltage VEL of the EM pulse. When the second switch element T2 is turned on, a current path is formed between the driving element DT and the light emitting element EL to supply current to the light emitting element EL. When the second switch element T2 is turned off, the current path between the driving element DT and the light emitting element EL is cut off.

The pixel circuit may further include a first capacitor C1, a second capacitor C2, a third switch element T3, and a fourth switch element T4.

The first capacitor C1 includes a first electrode connected to the data line and a second electrode connected to the first gate electrode G1 of the driving element DT and may supply the data voltage Vdata of the pixel data to the first gate electrode G1 of the driving element DT. The second capacitor C2 includes a first electrode connected to the power line to which the initialization voltage Vinit is applied, and a second electrode connected to the second electrode of the driving element DT. The first electrode of the first capacitor C1 and the first electrode of the second capacitor C2 are connected.

The third switch element T3 supplies the initialization voltage Vinit to the first and second capacitors C1 and C2. The fourth switch element T4 supplies the data voltage Vdata to the first and second capacitors C1 and C2.

The first, second, third and fourth switch elements T1 to T4 are turned on in response to the gate-on voltage VGH of the scan pulse and turned off in response to the gate-off voltage VGL of the scan pulse.

Figure 3:
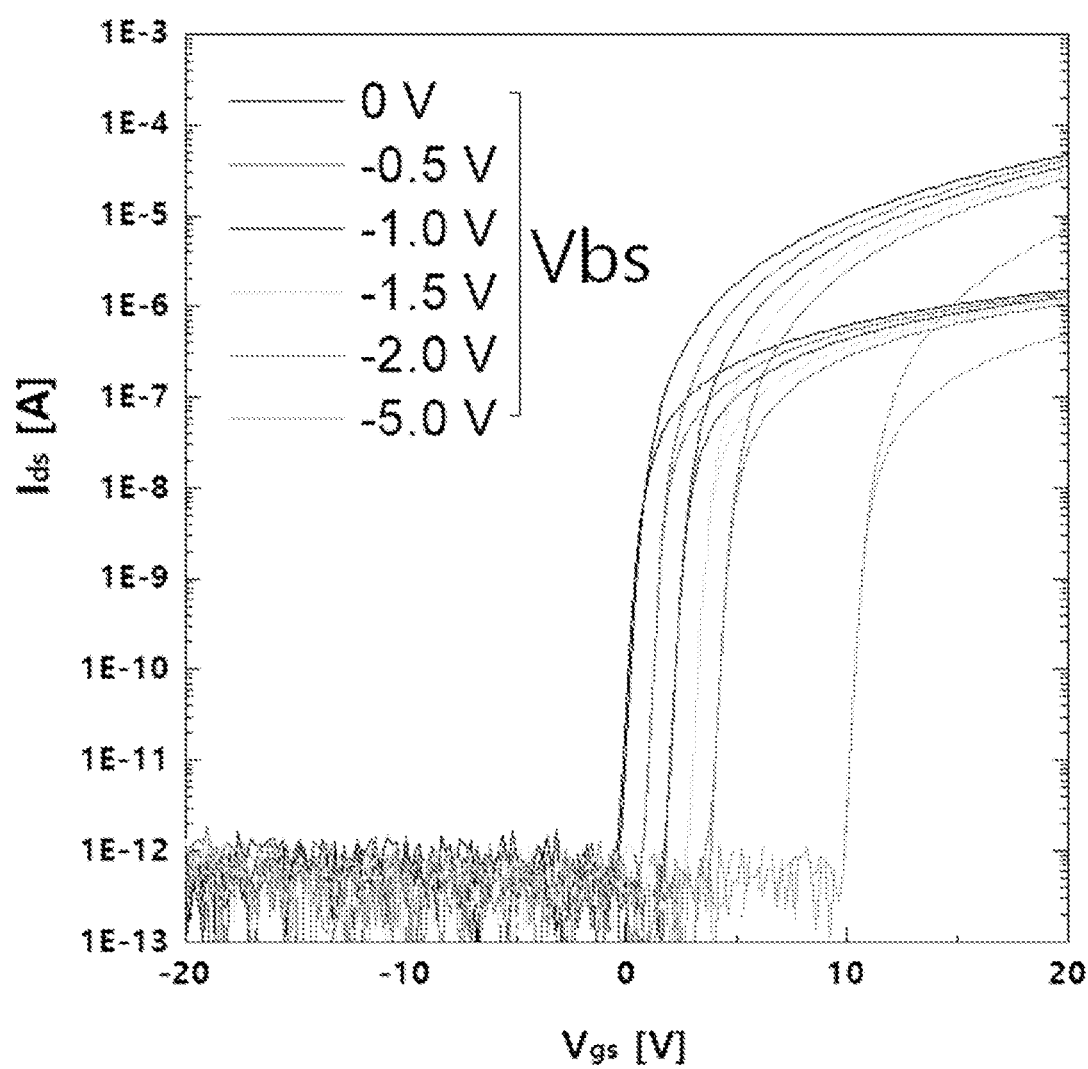
FIG. 3 is a diagram illustrating a simulation result for verifying an effect of shifting a threshold voltage of a driving element by Vbs shown in FIG. 2.

In FIG. 3, the horizontal axis represents a gate-source voltage (Vgs[V]) of the driving element DT, and the vertical axis represents a drain-source current Ids[A] of the driving element DT. When sensing the threshold voltage of the driving element DT, Vbs may shift the threshold voltage of the driving element DT within a range capable of sensing as shown in FIG. 3. Therefore, it is possible to accurately sense the threshold voltage of the driving element DT even if the shift of the threshold voltage of the driving element DT exceeds the range capable of sensing. For example, if the threshold voltage of the driving element DT is shifted to a voltage of 0V or less, the threshold voltage of the driving element DT cannot be sensed. However, because the threshold voltage of the driving element DT can be shifted to a positive voltage greater than 0V by applying Vbs to the driving element DT, the threshold voltage of the driving element DT can be sensed. The degree of threshold voltage shift of the driving element DT depends on Vbs, a parasitic capacitance (Cgi in FIG. 4) connected to the first gate electrode G1, and a parasitic capacitance (Cbuf in FIG. 4) connected to the second gate electrode G2, so that it is possible to shift the threshold voltage of the driving element to a desired voltage.

When the reference voltage Vref is applied to the first gate electrode G1 of the driving element DT and the initialization voltage Vinit is applied to the second gate electrode G2, the voltage of the first gate electrode G1 may be Vref+Vth in FIG. 2. Vref is a reference voltage, and Vth is a threshold voltage of the driving element DT shifted by Vbs. In this case, if Vref>Vinit, the threshold voltage of the driving element DT may be shifted to a positive voltage.

Figure 4:
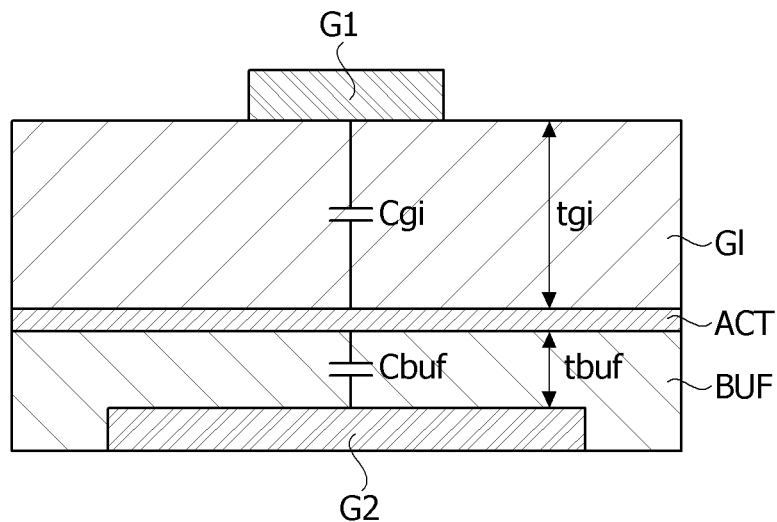
FIG. 4 is a cross-sectional diagram schematically illustrating a cross-sectional structure of a driving element.

FIG. 4 is a cross-sectional diagram schematically illustrating a cross-sectional structure of the driving element DT in the display panel 100.

Referring to FIG. 4, a first metal pattern may be formed on a substrate of the display panel 100. The first metal pattern may include the second gate electrode G2 of the driving element DT.

A first insulating layer BUF may be formed on the substrate to cover the first metal pattern. A semiconductor layer may be formed on the first insulating layer BUF. The semiconductor layer includes the semiconductor active pattern ACT of the driving element DT.

A second insulating layer GI may be formed on the first insulating layer BUF to cover the semiconductor pattern. A second metal pattern may be formed on the second insulating layer GI. The second metal pattern may include the first gate electrode G1 of the driving element DT.

In FIG. 4, "Cgi" is a capacitance formed between the first gate electrode G1 and the semiconductor active pattern ACT in the driving element DT, and "Cbuf" is a capacitance connected between the second gate electrode G2 and the semiconductor active pattern ACT in the driving element DT. In order to increase the effect of Vbs applied to the driving element DT, the capacitance of Cbuf may be greater than the capacitance of Cgi by setting the thickness tbuf of the first insulating layer BUF to be smaller than the thickness tgi of the second insulating layer GI.

Figure 6:
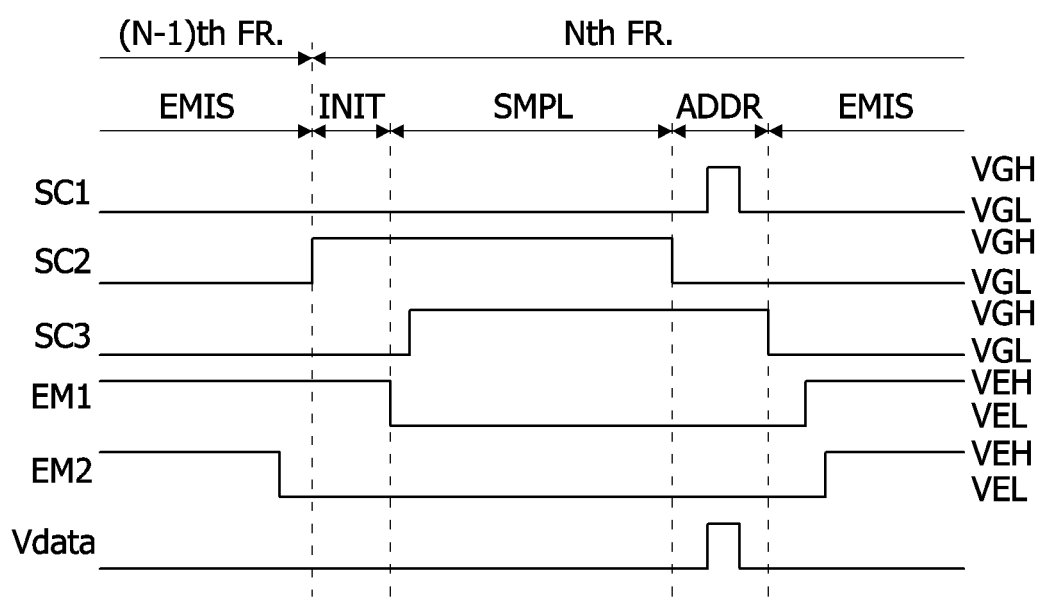
FIG. 6 is a waveform diagram illustrating a method of driving a pixel circuit according to one embodiment of the present disclosure.

FIG. 5 is a circuit diagram illustrating a pixel circuit according to another embodiment of the present disclosure. The pixel circuit illustrated in FIG. 5 includes an internal compensation circuit that samples the threshold voltage of the driving element DT and compensates for a variation in the threshold voltage of the driving element DT. FIG. 6 is a waveform diagram illustrating a method of driving a pixel circuit according to one embodiment of the present disclosure.

Referring to FIGS. 5 and 6, the pixel circuit includes a light emitting element EL, a driving element DT, first and second capacitors C1 and C2, and first, second, third, fourth, fifth, sixth and seventh switch elements T1 to T7. The driving element DT and the switch elements T1 to T7 may be implemented as n-channel oxide TFTs.

In this pixel circuit, a direct current voltage such as a pixel driving voltage VDD, a low-potential power supply voltage VSS, a reference voltage Vref, and an initialization voltage Vinit, a data voltage Vdata that varies according to a gray scale of pixel data, scan pulses SC1, SC2, and SC3, and EM pulses EM1 and EM2 are supplied. Voltages of the scan pulses SC1, SC2, and SC3 and the EM pulses EM1 and EM2 swing between the gate-on voltages VGH and VEH and the gate-off voltages VGL and VEL, respectively.

A voltage relationship commonly applied to the pixels may be set as VDD>Vref>Vinit>VSS. The data voltage Vdata may be generated as a gamma compensation voltage selected according to the gray scale of the pixel data from the data driver 110 in a voltage range lower than the pixel driving voltage VDD and higher than the low-potential power supply voltage VSS. The initialization voltage Vinit may be set as a voltage equal to or less than the threshold voltage of the light emitting element EL. The reference voltage Vref may be set as a voltage higher than the initialization voltage Vinit so that a negative back-bias is applied to the driving element DT in the sampling step SMPL. The gate-on voltages VGH and VEH may be set to be higher than the pixel driving voltage VDD. The gate-off voltages VGL and VEL may be set to be lower than the low-potential power supply voltage VSS.

The scan pulses SC1, SC2, and SC3 may include a first scan pulse SC1 applied to a first gate line GL1, a second scan pulse SC2 applied to a second gate line GL2, and a third scan pulse SC3 applied to a third gate line GL3. The EM pulses EM1 and EM2 may include a first EM pulse EM1 applied to a fourth gate line GL4 and a second EM pulse EM2 applied to a fifth gate line GL5.

The driving period of the pixel circuit may be divided into or include an initialization step INIT in which the pixel circuit is initialized, a sampling step SMPL in which the threshold voltage Vth of the driving element DT is sampled, an addressing step ADDR in which the data voltage Vdata is charged and pixel data is written, and a light emission step EMIS in which the light emitting element EL emits light with a brightness corresponding to the gray scale of the pixel data. In FIG. 6, "(N−1)th FR." denotes an (N−1)th frame period, and "Nth FR." denotes an Nth frame period.

The first scan pulse SC1 may be the gate-on voltage VGH in the addressing step ADDR. The first scan pulse SC1 may be the gate-off voltage VGL in the initialization step INIT, the sampling step SMPL, and the light emission step EMIS. The first scan pulse SC1 may be generated as a pulse equal to or less than one horizontal period 1H synchronized with the data voltage Vdata of the pixel data. The data voltage Vdata is supplied to the pixel circuit through the data line DL in the addressing step ADDR in synchronization with the first scan pulse SC1.

The second scan pulse SC2 may rise to the gate-on voltage VGH prior to the third scan pulse SC3 and fall to the gate-off voltage VGL prior to a falling edge of the third scan pulse SC3. The second scan pulse SC2 may be the gate-on voltage VGH in the initialization step INIT and the sampling step SMPL. The second scan pulse SC2 may be the gate-off voltage VGL in the addressing step ADDR and the light emission step EMIS.

The third scan pulse SC3 may be generated as the gate-on voltage VGH in the sampling step SMPL and the addressing step ADDR. In the addressing step ADDR, a gate-on voltage section of the third scan pulse SC3 may overlap with a gate-on voltage section of the first scan pulse SC1. The third scan pulse SC3 may rise to the gate-on voltage VGH after a rising edge of the second scan pulse SC2 and then fall to the gate-off voltage VGL after a falling edge of the second scan pulse SC2. The third scan pulse SC3 may be the gate-off voltage VGL in the initialization step INIT and the light emission step EMIS.

The first EM pulse EM1 may be generated as the gate-on voltage VEH in the initialization step INIT and generated as the gate-on voltage VEH during at least a partial period of the light emission step EMIS. The first EM pulse EM1 may be the gate-off voltage VEL in the sampling step INIT and the addressing step ADDR. The first EM pulse EM1 may fall to the gate-off voltage VEL after a falling edge of the second EM pulse EM2 and rise to the gate-on voltage VEH before a rising edge of the second EM pulse EM2.

The second EM pulse EM2 may be generated as the gate-on voltage VEH during at least a partial period of the light emission step EMIS. The second EM pulse EM2 may be the gate-off voltage VEL in the initialization step INIT, the sampling step INIT, and the addressing step ADDR.

The light emitting element EL may be implemented as an OLED. The anode electrode of the light emitting element EL may be connected to a fourth node n4, and the low-potential power supply voltage VSS may be applied to the cathode electrode of the light emitting element EL.

The first capacitor C1 may be connected between the second node n2 and the fifth node n5. The first capacitor C1 stores the threshold voltage Vth of the driving element DT in the sampling step SMPL. In the addressing step ADDR, the data voltage Vdata is transferred to the first gate electrode G1 of the driving element DT through the first capacitor C1.

The second capacitor C2 is connected between the third node n1 and the fifth node n5. The second capacitor C2 stores the second electrode voltage, e.g., the source voltage, of the driving element DT at the beginning of the light emission step EMIS and maintains the gate-source voltage Vgs of the driving element during the light emission step EMIS.

The driving element DT may be a MOSFET having a double gate structure. The driving element DT includes a first gate electrode connected to the second node n2, a second gate electrode connected to the fourth node n4, a first electrode connected to the first node n1, and a second electrode connected to the third node n3. As shown in FIG. 4, the first and second gate electrodes of the driving element DT may overlap each other with the semiconductor active pattern therebetween.

The first switch element T1 includes a first electrode connected to the first node n1, a second electrode connected to the second node n2, and a gate electrode to which the second scan pulse SC2 is applied. The first switch element T1 is turned on in the initialization step INIT and the sampling step SMPL in response to the gate-on voltage VGH of the second scan pulse SC2 and connects the first node n1 and the second node n2. When the first switch element T1 is turned on, the driving element DT operates as a diode because the first gate electrode G1 and the first electrode are connected.

The second switch element T2 includes a first electrode connected to the third node n3, a second electrode connected to the fourth node n4, and a gate electrode to which the second EM pulse EM2 is applied. The second switch element T2 is turned on during at least a partial period of the light emission step EMIS in response to the gate-on voltage VEH of the second EM pulse EM2 and forms a current path between the driving element DT and the light emitting element EL. In the initialization step INIT, the sampling step SMPL, and the addressing step ADDR, in which the second switch element T2 is in an off state, the current path between the driving element DT and the light emitting element EL is cut off, and thus the light emitting element EL does not emit light.

The third switch element T3 includes a first electrode connected to the second power line INL to which the initialization voltage Vinit is applied, a second electrode connected to the fifth node n5, and a gate electrode to which the second scan pulse SC2 is applied. The third switch element T3 is turned on in the initialization step INIT and the sampling step SMPL in response to the gate-on voltage VGH of the second scan pulse SC2 and supplies the initialization voltage Vinit to the fifth node n5. In the addressing step ADDR and the light emission step EMIS in which the third switch element T3 is turned off, a current path between the second power line INL and the fifth node n5 is cut off.

The fourth switch element T4 includes a first electrode connected to the data line DL to which the data voltage Vdata is applied, a second electrode connected to the fifth node n5, and a gate electrode to which the first scan pulse SC1 is applied. The fourth switch element T4 is turned on in the addressing step ADDR in response to the gate-on voltage VGH of the first scan pulse SC1 and supplies the data voltage Vdata to the fifth node n5. In the initialization step INIT, the sampling step SMPL, and the light emission step EMIS, in which the fourth switch element T4 is turned off, a current path between the data line DL and the fifth node n5 is cut off.

The fifth switch element T5 includes a first electrode connected to the first power line VDDL to which the pixel driving voltage VDD is applied, a second electrode connected to the first node n1, and a gate electrode to which the first EM pulse EM1 is applied. The fifth switch element T5 is turned on in the initialization step INIT and the light emission step EMIS in response to the gate-on voltage VEH of the first EM pulse EM1 and supplies the pixel driving voltage VDD to the first node n1. In the sampling step SMPL and the addressing step ADDR, in which the fifth switch element T5 is turned off, a current path between the first power line VDDL and the first node n1 is cut off.

The sixth switch element T6 includes a first electrode connected to the third node n3, a second electrode connected to the third power line REFL to which the reference voltage Vref is applied, and a gate electrode to which the third scan pulse SC3 is applied. The sixth switch element T6 is turned on in the sampling step SMPL and the addressing step ADDR in response to the gate-on voltage VGH of the third scan pulse SC3 and supplies the reference voltage Vref to the third node n3. In the initialization step INIT and the light emission step EMIS, in which the sixth switch element T6 is turned off, a current path between the third power line REFL and the third node n3 is cut off.

The seventh switch element T7 includes a first electrode connected to the second power line INL to which the initialization voltage Vinit is applied, a second electrode connected to the fourth node n4, and a gate electrode to which the third scan pulse SC3 is applied. The seventh switch element T7 is turned on in the sampling step SMPL and the addressing step ADDR in response to the gate-on voltage VGH of the third scan pulse SC3 and supplies the initialization voltage Vinit to the fourth node n4. In the initialization step INIT and the light emission step EMIS, in which the seventh switch element T7 is turned off, a current path between the second power line INL and the fourth node n4 is cut off.

In the present disclosure, the sampling step SMPL and the addressing step ADDR may be separated by applying the reference voltage Vref to the third node n3 to sample the threshold voltage Vth of the driving element DT in the sampling step SMPL and applying the data voltage Vdata in the addressing step ADDR. As a result, according to the present disclosure, the threshold voltage Vth of the driving element DT can be accurately sensed by ensuring a sufficiently long time, for example, two or more horizontal periods, of the sampling step SMPL, and thereby the shift of the threshold voltage Vth can be compensated.

Hereinafter, a step-by-step driving method of the pixel circuit will be described in detail with reference to FIGS. 7 to 10.

Figure 7:
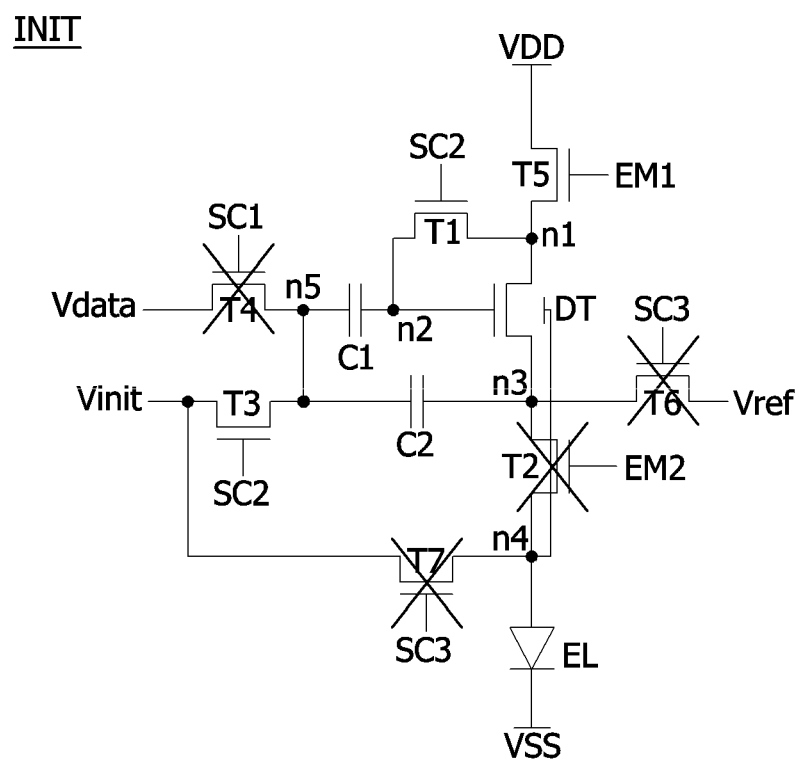
FIG. 7 is a circuit diagram illustrating an initialization step of the pixel circuit shown in FIG. 5.

FIG. 7 is a circuit diagram illustrating an initialization step INIT of the pixel circuit shown in FIG. 5.

Referring to FIG. 7, in the initialization step INIT, the second scan pulse SC2 and the first EM pulse EM1 are generated as the gate-on voltages VGH and VEH, and the other gate signals SC1, SC3, and EM2 are the gate-off voltages VGL and VEL. In the initialization step INIT, the second, fourth, sixth and seventh switch elements T2, T4, T6, and T7 are turned off. Therefore, in the initialization step INIT, the first, third and fifth switch elements T1, T3 and T5 and the driving element DT are turned on. In this case, the first gate electrode and the first electrode of the driving element DT are connected as a diode connection.

In the initialization step INIT, the voltages of the first and second nodes n1 and n2 are initialized to the pixel driving voltage VDD, and the voltage of the third node n3 is changed to VDD−Vth0. Here, Vth0 is an initial threshold voltage that Vbs is not applied to the driving element DT. The voltage of the fifth node n5 is the initialization voltage Vinit. The voltage of the fourth node n4 is maintained as the initialization voltage Vinit applied to the previous frame.

Figure 8:
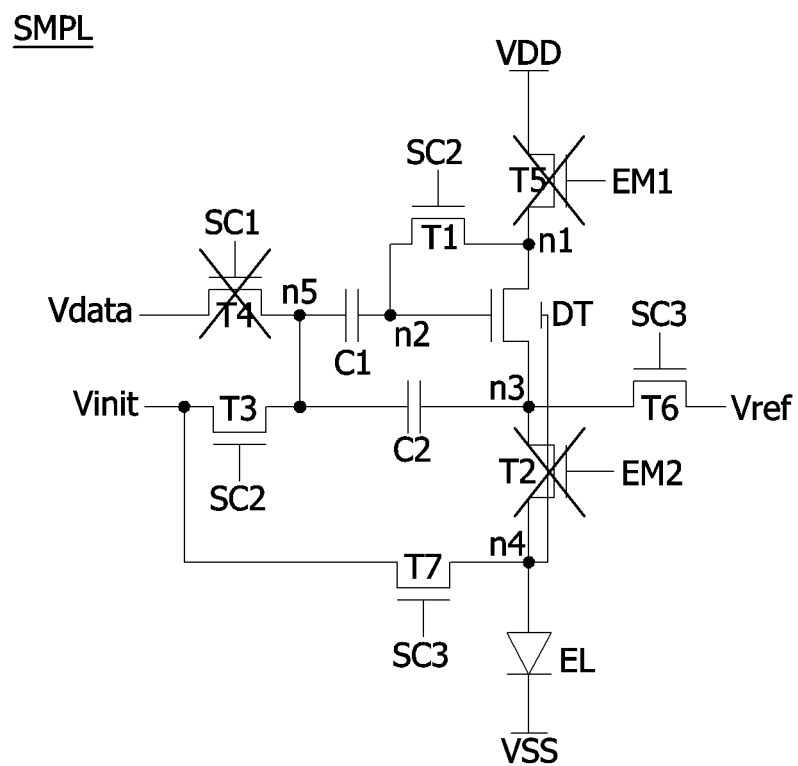
FIG. 8 is a circuit diagram illustrating a sampling step of the pixel circuit shown in FIG. 5.

FIG. 8 is a circuit diagram illustrating a sampling step SMPL of the pixel circuit shown in FIG. 5.

Referring to FIG. 8, in the sampling step SMPL, the third scan pulse SC3 is inverted to the gate-on voltage VGH, and the first EM pulse EM1 is inverted to the gate-off voltage VEL. In the sampling step SMPL, the second scan pulse SC2 maintains the gate-on voltage VGH. In the sampling step SMPL, the second and third scan pulses SC2 and SC3 are the gate-on voltage VGH, and the other gate signals SC1, EM1, and EM2 are the gate-off voltages VGL and VEL. Therefore, in the sampling step SMPL, the first, third, sixth, and seventh switch elements T1, T3, T6, and T7 and the driving element DT are turned on.

In the sampling step SMPL, the initialization voltage Vinit is applied to the second gate electrode G2 of the driving element DT through the turned-on third switch element T3, and the reference voltage Vref higher than the initialization voltage Vinit is applied to the second electrode of the driving element DT through the turned-on sixth switch element T6. Therefore, Vbs is applied to the driving element DT, so that the threshold voltage of the driving element DT can be shifted to a positive voltage higher than zero.

In the sampling step SMPL, the voltages of the first and second nodes n1 and n2 are changed to Vref+Vth0+α. Here, α is β (Vref−Vinit), and β is Cbuf/Cgi. The voltage of the third node n3 is the reference voltage Vref, and the voltages of the fourth and fifth nodes n4 and n5 are maintained as the initialization voltage Vinit.

Figure 9:
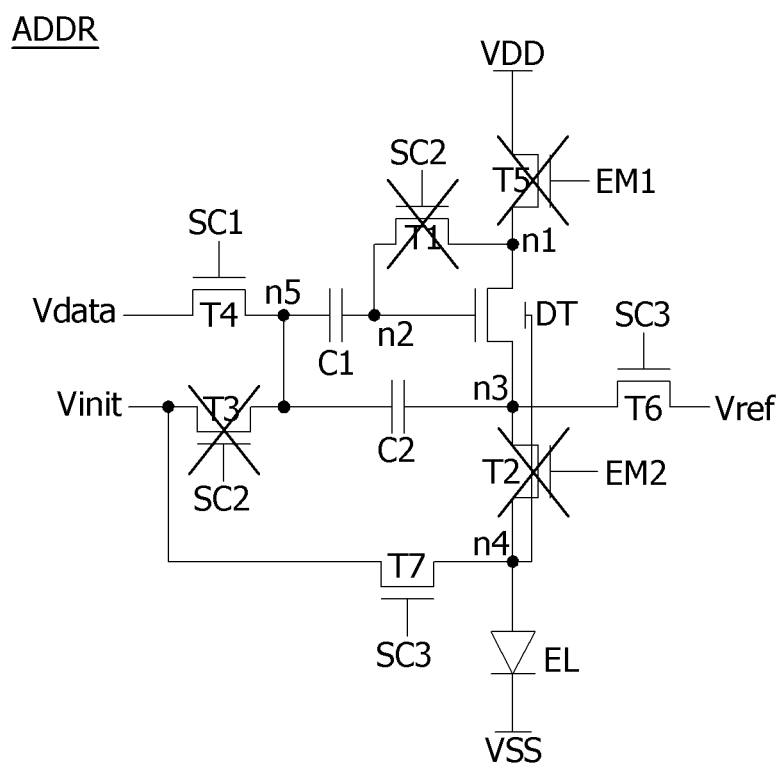
FIG. 9 is a circuit diagram illustrating an addressing step of the pixel circuit shown in FIG. 5.

FIG. 9 is a circuit diagram illustrating an addressing step ADDR of the pixel circuit shown in FIG. 5.

Referring to FIG. 9, in the addressing step ADDR, the first scan pulse SC1 synchronized with the data voltage Vdata of the pixel data is generated as the gate-on voltage VGH. In the addressing step ADDR, the third scan pulse SC3 maintains the gate-on voltage VGH and is then inverted to the gate-off voltage VGL. In the addressing step ADDR, the first EM pulse EM1 maintains the gate-off voltage VEL and is then inverted to the gate-on voltage after the falling edge of the first scan pulse SC1. In the addressing step ADDR, the second scan pulse SC2 is inverted to the gate-off voltage VGL. In the addressing step ADDR, the voltages of the first and second EM pulses EM1 and EM2 may be the gate-off voltage VEL. Therefore, in the addressing step ADDR, the first, fourth, sixth, and seventh switch elements T1, T4, T6, and T7 and the driving element DT are turned on.

In the addressing step ADDR, the voltage of the first node n1 is maintained at Vref+Vth0+α, and the voltage of the second node n2 is changed to Vref+Vth0+α+C'(Vdata−Vinit). Here, C' may be expressed as C1/(C1+Cpar). "Cpar" is a parasitic capacitance connected to the first gate electrode G1 of the driving element DT. When Cpar is 0, C' becomes 1, so the data transfer rate is high. The higher the Cpar, the lower the data transfer rate. The voltage of the third node n3 is the reference voltage Vref, and the voltages of the fourth and fifth nodes n4 and n5 are maintained as the initialization voltage Vinit.

Figure 10:
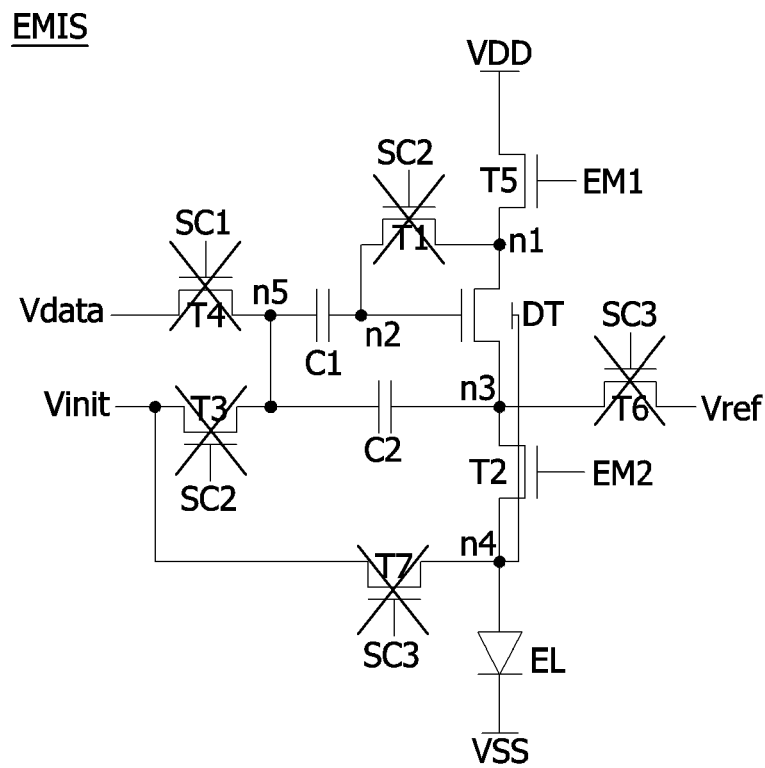
FIG. 10 is a circuit diagram illustrating a light emission step of the pixel circuit shown in FIG. 5.

FIG. 10 is a circuit diagram illustrating a light emission step EMIS of the pixel circuit shown in FIG. 5.

Referring to FIG. 10, in the light emission step EMIS, the voltages of the scan pulses SC1, SC2, and SC3 are the gate-off voltage VGL. The first and second EM pulses EM1 and EM2 are generated as the gate-on voltage VEH during at least a partial period in the light emission step EMIS. Therefore, in the light emitting step EMIS, the driving element DT and the second and fifth switch elements T2 and T5 are turned on, and the first, third, fourth, sixth and seventh switch elements T1, T3, T4, T6 and T7 are turned off. At this time, Vbs is not applied to the driving element DT, and a current is supplied to the light emitting element EL according to the gate-source voltage Vgs of the driving element DT, so that the light emitting element EL can be turned on.

In the light emission step EMIS, a current Ioled flowing through the light emitting element EL is $k[(Vref-Vinit)+C'(Vdata-Vref)\pm(Vth0+\alpha-Vth0)]^2$. Here, k is a constant value determined according to the mobility and parasitic capacitance of the driving element DT. Assuming the condition C'=1 by ignoring the parasitic capacitance of the second node n2, Ioled may be $k[(Vdata-Vinit)+\alpha)]^2$.

During the light emission step EMIS, the initialization voltage Vinit applied to the second gate electrode of the driving element DT is substantially the same as the source voltage of the driving element DT. For this reason, there is no shift in the threshold voltage of the driving element DT due to the voltage of the second gate electrode of the driving element DT in the light emission step EMIS.

Figure 11:
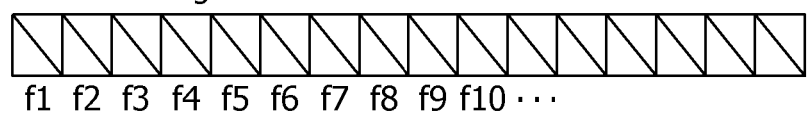
FIG. 11 is a diagram illustrating a refresh rate in a normal driving mode and a low-speed driving mode.
Figure 11:
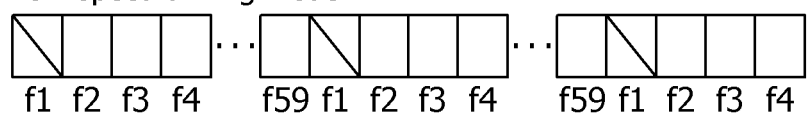
Figure 12:
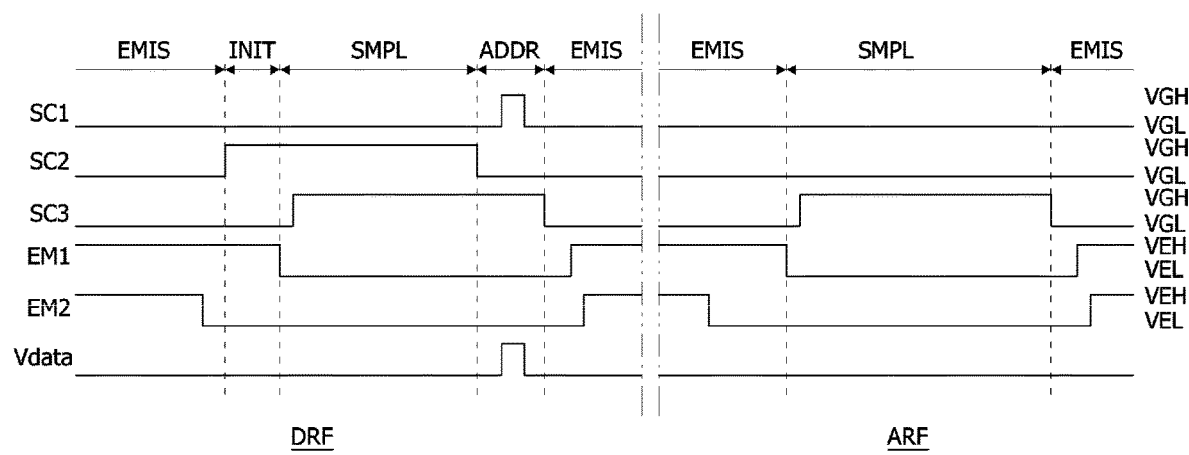
FIG. 12 is a waveform diagram illustrating a signal applied to a pixel circuit in a normal driving mode and a low-speed driving mode.

FIG. 11 is a diagram illustrating a refresh rate in a normal driving mode and a low-speed driving mode. FIG. 12 is a waveform diagram illustrating a signal applied to a pixel circuit in a normal driving mode and a low-speed driving mode. In FIG. 11, "fx" indicates the x-th frame period.

Referring to FIGS. 11 and 12, the frequency of a data refresh frame in which pixel data is written into the pixel circuit is set to be lower in the low-speed driving mode than in the normal driving mode.

The driving time of the pixel circuit may be divided into the initialization step INIT, the sampling step SMPL, the addressing step ADDR, and the light emission step EMIS in every frame of the normal driving mode and the data refresh frame of the low-speed driving mode. The low-speed driving mode may include one or more anode reset frames (ARFs) allocated after the data refresh frame. In the anode reset frame (ARF), the driving time of the pixel circuit may be divided into the sampling step SMPL and the light emission step EMIS without the initialization step INIT. At least one of the anode reset frames (ARFs) may further include the addressing step ADDR.

The timing controller 130 lowers a frame rate frequency at which pixel data is written to pixels in the low-speed driving mode compared to the normal driving mode. For example, the data refresh frame (DRF) in which pixel data is written to pixels in the normal driving mode may occur at a frequency of 60 Hz or higher, for example, at any one refresh rate of 60 Hz, 120 Hz, and 144 Hz, and the data refresh frame (DRF) in the low-speed driving mode may occur at a refresh rate of a lower frequency than that of the low-speed driving mode.

When the refresh rate of the low-speed driving mode is 1 Hz, one data refresh frame (DRF) is allocated per second, and the remainder of the 60 frames may be the anode reset frame (ARF). During the anode reset frame (ARF) of the low-speed driving mode, the source drive IC in which the data driver 110 is integrated does not output a data voltage and thus does not generate power consumption. During the anode reset frame (ARF), the reference voltage Vref is applied to the third node n3 of each of the sub-pixels and thereby resets the Vgs of the driving element DT stored in the previous data refresh frame (DRF). Therefore, in the low-speed driving mode, the luminance of the sub-pixels is not reduced during the anode reset frame (ARF), so that flicker is not recognized.

The second scan pulse SC2 is not generated in the anode reset frame (ARF) of the low-speed driving mode, the second gate line GL2 maintains the gate-off voltage VGL, and the other gate pulses SC1, SC3, EM1, and EM2 may be generated substantially the same as in the normal driving mode.

Figure 13:
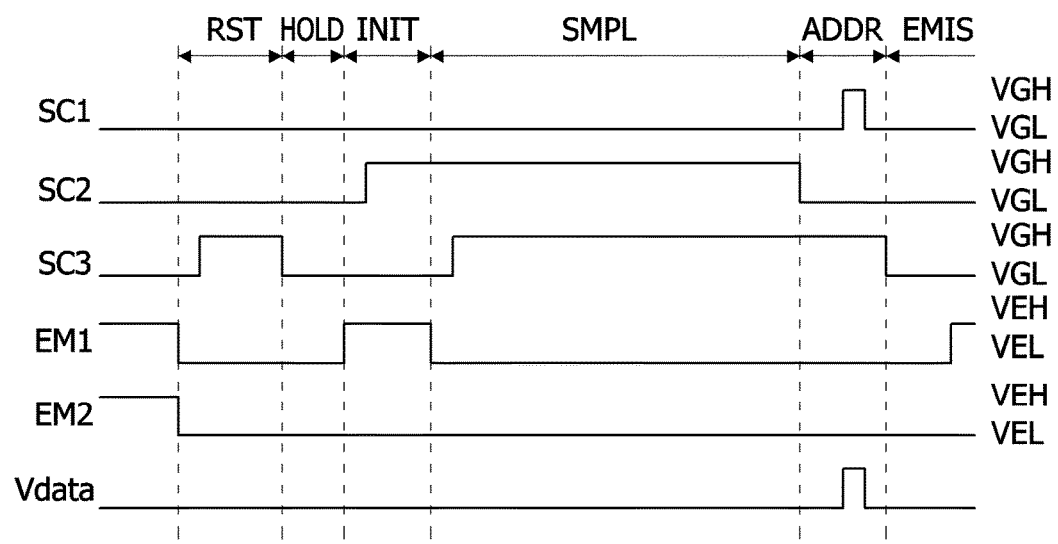
FIG. 13 is a waveform diagram illustrating a method of driving a pixel circuit according to another embodiment of the present disclosure.
Figure 14:
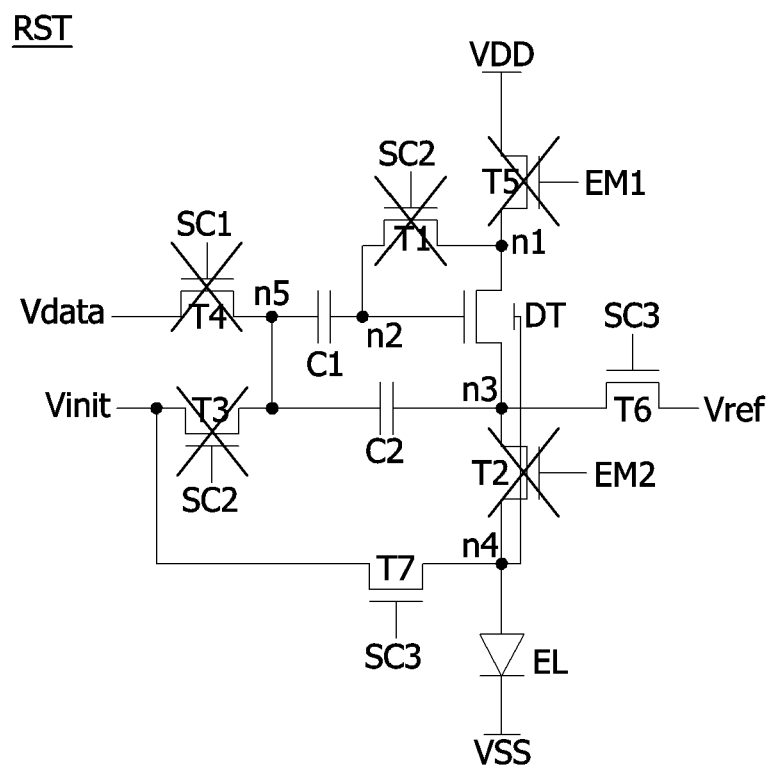
FIG. 14 is a circuit diagram illustrating a reset step of a pixel circuit.

FIG. 13 is a waveform diagram illustrating a method of driving a pixel circuit according to another embodiment of the present disclosure. FIG. 14 is a circuit diagram illustrating a reset step of a pixel circuit.

Referring to FIGS. 13 and 14, the reset step RST may be set prior to the initialization step INIT.

In the reset step RST, the third scan pulse SC3 is generated as the gate-on voltage VGH, and the other gate signals SC1, SC2, EM1, and EM2 are the gate-off voltages VGL and VEL. Therefore, in the reset step RST, the sixth and seventh switch elements T6 and T7 are turned on, so that residual charges accumulated in the anode electrode of the light emitting element EL are discharged, and charges of the capacitors C1 and C2 are discharged. As a result, the present disclosure can reset the voltages charged in the capacitors C1 and C2 and the capacitor of the OLED in the previous frame, thereby preventing voltage fluctuation due to the influence of the previous voltage before sampling starts.

A hold step HOLD may be set between the reset step RST and the initialization step INIT. In the hold step HOLD, all the gate signals SC1, SC2, SC3, EM1, and EM2 are generated as the gate-off voltages, so that main nodes of the pixel circuit can be floating.

In the pixel circuit, the first switch element T1 connects the driving element DT through a diode connection in the sampling step SMPL in response to the second scan pulse SC2. At this time, the threshold voltage Vth of the driving element DT is sampled at the second node n2.

Figure 15:
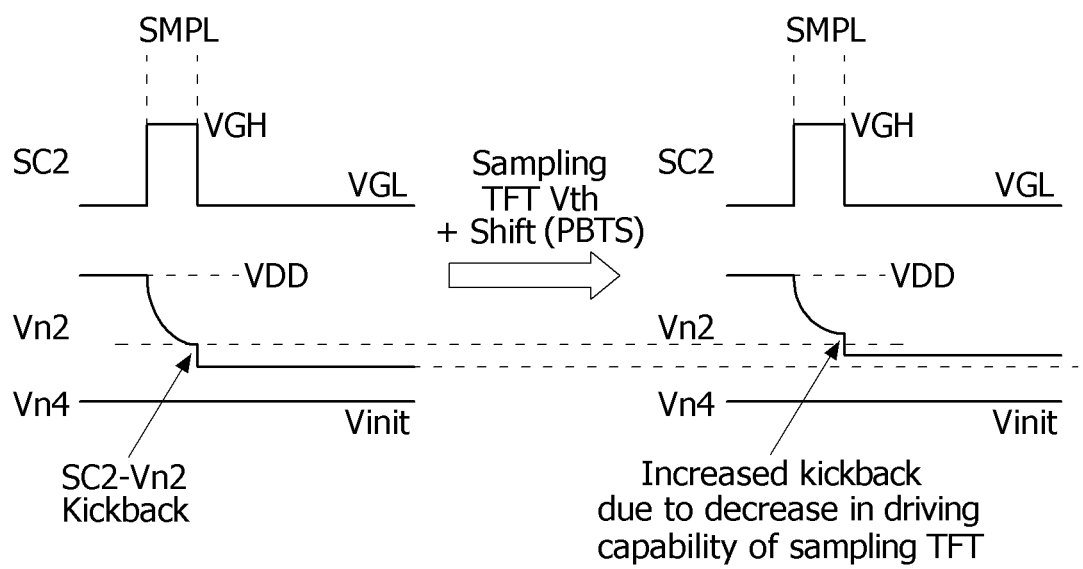
FIG. 15 is a waveform diagram illustrating a kickback voltage that increases as an accumulated driving time of a sampling switch element increases in a pixel circuit.

When the first switch element T1 is turned off due to a change in the gate voltage at the falling edge of the second scan pulse SC2, a kickback voltage is generated as shown in FIG. 15 at the voltage of the node n2 to which the second gate electrode of the driving element DT is connected. In FIG. 15, 'Vn2' is the voltage of the second node n2, and 'Vn4' is the voltage of the fourth node n4. A variation in the kickback voltage of the second node voltage Vn2 may cause a threshold voltage sampling error of the driving element DT. When the threshold voltage of the first switch element T1 changes to a positive direction due to a positive bias temperature stress (PBTS) that increases as the accumulated driving time of the first switch element T1 increases, the kickback voltage may increase. Such a kickback voltage variation may cause a threshold voltage sampling error of the driving device DT to increase a current variation width flowing through the light emitting element EL in the light emitting step EMIS.

Figure 16:
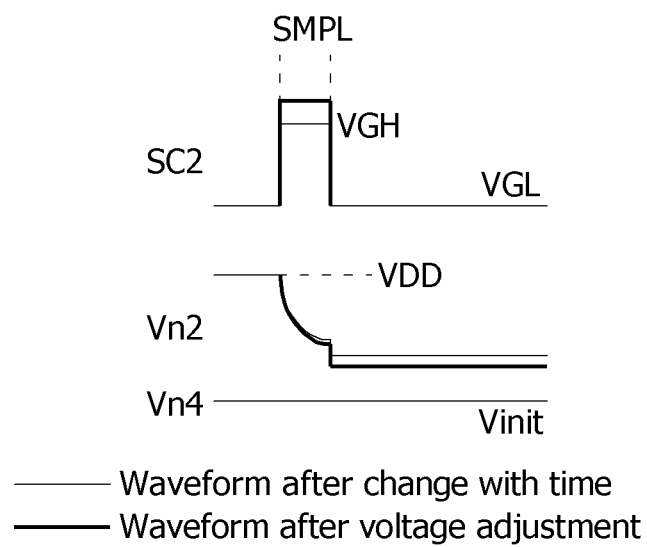
FIGS. 16 to 18 are waveform diagrams illustrating examples of gate voltages and data voltages that vary as an accumulated driving time of a pixel circuit increases.
Figure 17:
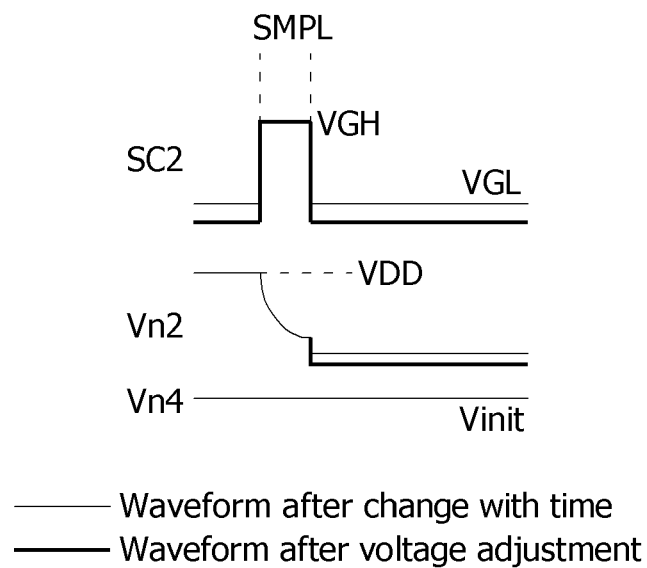
Figure 18:
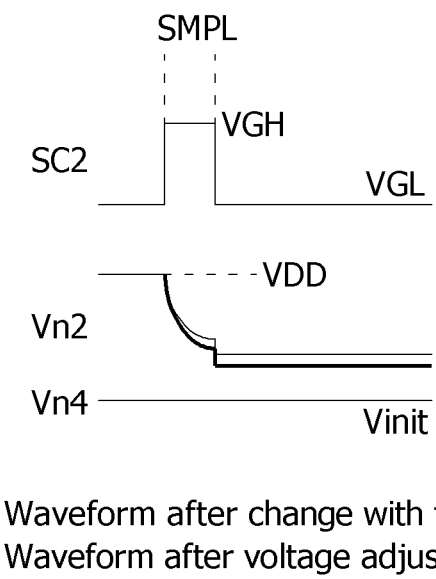

As shown in FIGS. 16 to 18, the present disclosure adjusts the gate-on voltage VGH or the gate-off voltage VGL of at least the second scan pulse SC2 among the gate signals or adjusts the data voltage Vdata according to the accumulated driving time of the pixel circuit, and thereby it can offset the kickback voltage that increases as the accumulated driving time increases. In the same manner as the voltage adjustment method of the second scan pulse SC2, the gate voltages of the other scan pulse SC1 and the EM pulse EM can be changed according to the accumulated driving time of the pixel circuit.

Referring to FIG. 16, under the control of the timing controller 130, the power supply 140 may increase the gate-on voltage VGH as the accumulated driving time of the pixel circuit increases. As a result, as the kickback voltage increases, the voltage of the second node Vn2 may decrease. At this time, the threshold voltage sampling rate of the driving element DT may be increased.

Referring to FIG. 17, under the control of the timing controller 130, the power supply 140 may lower the gate-off voltage VGL as the accumulated driving time of the pixel circuit increases. As a result, as the kickback voltage increases, the voltage of the second node Vn2 may decrease.

The timing controller 130 may change the data voltage Vdata outputted from the data driver 110 by changing the pixel data value of an input image or by changing the gamma reference voltage VGMA outputted from the power 140. As shown in FIG. 18, as the accumulated driving time of the pixel circuit increases, the data voltage Vdata may decrease, so that an increase in the kickback voltage Vdata may be offset. The embodiments shown in FIGS. 16 to 18 are also applicable to the pixel circuit shown in FIG. 19.

Figure 19:
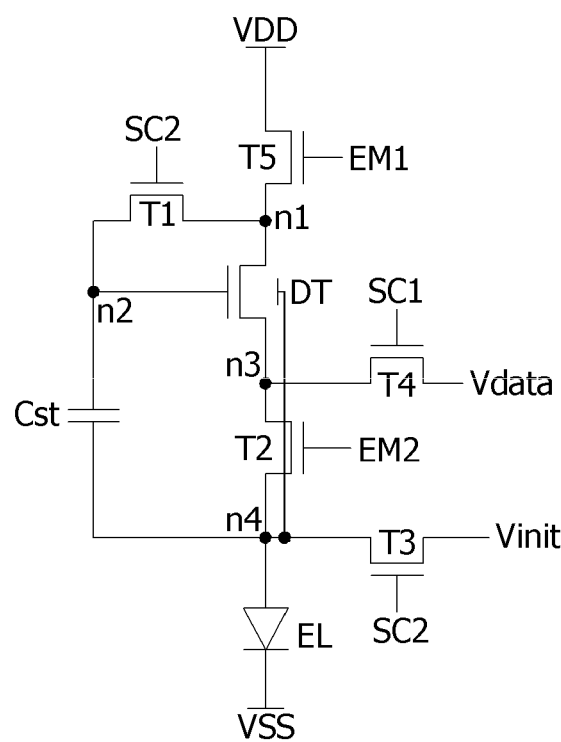
FIG. 19 is a circuit diagram illustrating another example of a pixel circuit applicable to the present disclosure.

The pixel circuit shown in FIG. 19 includes a light emitting element EL, six transistors DT, T1 to T5, and one capacitor Cst, and samples the threshold voltage Vth of the driving element DT using a diode connection circuit in the sampling step SMPL.

Referring to FIG. 19, a driving element DT may be a MOSFET having a double gate structure to which a negative back-bias can be applied. The driving element DT includes a first gate electrode connected to a second node n2, a second gate electrode connected to a fourth node n4, a first electrode connected to a first node n1, and a second electrode connected to a third node n3.

A first switch element T1 includes a first electrode connected to the first node n1, a second electrode connected to the second node n2, and a gate electrode to which the second scan pulse SC2 is applied. A second switch element T2 includes a first electrode connected to the third node n3, a second electrode connected to the fourth node n4, and a gate electrode to which the second EM pulse EM2 is applied. A third switch element T3 includes a first electrode to which the initialization voltage Vinit is applied, a second electrode connected to the fourth node n4, and a gate electrode to which the second scan pulse SC2 is applied. A fourth switch element T4 includes a first electrode to which the data voltage Vdata is applied, a second electrode connected to the third node n3, and a gate electrode to which the first scan pulse SC1 is applied. A fifth switch element T5 includes a first electrode to which the pixel driving voltage VDD is applied, a second electrode connected to the first node n1, and a gate electrode to which the first EM pulse EM1 is applied.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pixel circuit comprising:
a driving element including:
  a first electrode electrically connected to a first node;
  a first gate electrode electrically connected to a second node;
  a second electrode electrically connected to a third node; and
  a second gate electrode to which an initialization voltage is applied;
a light emitting element including:
  an anode electrode electrically connected to a fourth node; and
  a cathode electrode to which a power supply voltage is applied, the light emitting element, in operation, being driven according to a current from the driving element;
a first switch element electrically connected between the first node and the second node;
a second switch element electrically connected in series between the third node and the fourth node configured to selectively electrically connect and disconnect the third node to the fourth node;
a first capacitor electrically connected to the first gate electrode of the driving element and to which a data voltage of pixel data is applied; and
a second capacitor electrically connected to the third node and to which the initialization voltage is applied.

2. The pixel circuit of claim 1, wherein, in operation, a threshold voltage of the driving element is shifted to a voltage capable of being sensed, the shifting being by a voltage between the second gate electrode and the second electrode of the driving element.

3. The pixel circuit of claim 1, further comprising:
a first insulating layer disposed above the second gate electrode;
a semiconductor active pattern of the driving element disposed above the first insulating layer; and
a second insulating layer disposed above the semiconductor active pattern and disposed under the first gate electrode,
wherein a thickness of the first insulating layer is smaller than a thickness of the second insulating layer.

4. The pixel circuit of claim 1, further comprising:
a third switch element coupling the initialization voltage to the second capacitor; and
a fourth switch element coupling the data voltage to the first capacitor.

5. The pixel circuit of claim 1, further comprising:
a third switch element including a first electrode to which the initialization voltage is applied, a second electrode connected to a fifth node, and a gate electrode to which a second scan pulse is applied;
a fourth switch element including a first electrode to which the data voltage is applied, a second electrode connected to the fifth node, and a gate electrode to which a first scan pulse is applied;
a fifth switch element including a first electrode to which a pixel driving voltage is applied, a second electrode connected to the first node, and a gate electrode to which a first emission control (EM) pulse is applied;
a sixth switch element including a first electrode to which a reference voltage is applied, a second electrode connected to the third node, and a gate electrode to which a third scan pulse is applied; and
a seventh switch element including a first electrode to which the initialization voltage is applied, a second electrode connected to the fourth node, and a gate electrode to which the third scan pulse is applied,
wherein the first switch element includes a first electrode connected to the first node, a second electrode connected to the second node, and a gate electrode to which the second scan pulse is applied,
the second switch element includes a first electrode connected to the third node, a second electrode connected to the fourth node, and a gate electrode to which a second EM pulse is applied,
the first capacitor includes a first electrode connected to the fifth node, and a second electrode connected to the second node, and
the second capacitor includes a first electrode connected to the fifth node, and a second electrode connected to the third node.

6. The pixel circuit of claim 5, wherein the driving element and the first, second, third, fourth, fifth, sixth and seventh switch elements include an n-channel oxide semiconductor, and
each of the first, second, third, fourth, fifth, sixth and seventh switch elements, in operation, is turned on in response to a gate-on voltage applied at the corresponding gate electrode thereof.

7. The pixel circuit of claim 1, wherein the initialization voltage is between a pixel driving voltage and the power supply voltage, the pixel driving voltage, in operation, being applied to the first electrode of the driving element.

8. The pixel circuit of claim 6, wherein the driving element, in operation, shifts a threshold voltage thereof in response to the initialization voltage being applied to the second gate electrode thereof.

9. The pixel circuit of claim 5, wherein when the pixel driving voltage is VDD, the reference voltage is Vref, the initialization voltage is Vinit, and the power supply voltage is VSS, the voltages are set as VDD>Vref>Vinit>VSS, the data voltage of the pixel data is lower than the pixel driving voltage and higher than the power supply voltage, and each of the first, second and third scan pulses and the first and second EM pulses swings between a gate-on voltage and a gate-off voltage, the gate-on voltage being higher than the pixel driving voltage, the gate-off voltage being lower than the power supply voltage.

10. The pixel circuit of claim 6, wherein the pixel circuit is driven in an initialization step, a sampling step after the initialization step, an addressing step in which the data voltage is applied after the sampling step, and a light emission step after the addressing step, the first scan pulse is generated as the gate-on voltage in the addressing step in synchronization with the data voltage, and is generated as a gate-off voltage in the initialization step, the sampling step, and the light emission step, the second scan pulse is generated as the gate-on voltage in the initialization step and the sampling step, and is generated as the gate-off voltage in the addressing step and the light emission step, the third scan pulse is generated as the gate-on voltage in the sampling step and the addressing step, and is generated as the gate-off voltage in the initialization step and the light emission step, the first EM pulse is generated as the gate-on voltage in the initialization step and the light emission step, and is generated as the gate-off voltage in the sampling step and the addressing step, and the second EM pulse is generated as the gate-on voltage in the light emission step, and is generated as the gate-off voltage in the initialization step, the sampling step, and the addressing step.

11. The pixel circuit of claim 1, wherein scan pulses applied to the first and second switch elements swing between a gate-on voltage and a gate-off voltage, and as an accumulated driving time of the pixel circuit increases, the gate-on voltage of at least a scan pulse applied to the first switch element among the scan pulses increases, the gate-off voltage of the at least a scan pulse applied to the first switch element among the scan pulses decreases, or both.

12. The pixel circuit of claim 1, wherein as an accumulated driving time of the pixel circuit increases, the data voltage decreases.

13. The pixel circuit of claim 10, wherein in the sampling step, a threshold voltage of the driving element is sampled.

14. A display device comprising:
a display panel in which a plurality of data lines, a plurality of gate lines intersected with the data lines, a first power line to which a pixel driving voltage is applied, a second power line to which an initialization voltage is applied, a third power line to which a reference voltage is applied, a fourth power line to which a power supply voltage is applied, and a plurality of pixel circuits electrically connected to the data lines, the gate lines, and the first, second, third and fourth power lines are disposed;

a data driver that, in operation, supplies a data voltage of pixel data to the data lines; and
a gate driver that, in operation, supplies a gate signal to the gate lines,
wherein each of the pixel circuits includes:
a driving element including a first electrode electrically connected to a first node, a first gate electrode electrically connected to a second node, a second electrode electrically connected to a third node, and a second gate electrode to which an initialization voltage is applied;
a light emitting element including an anode electrode electrically connected to a fourth node and a cathode electrode to which a power supply voltage is applied, the light emitting element being driven according to a current from the driving element;
a first switch element electrically connected between the first node and the second node;
a second switch element directly connected between the third node and the fourth node;
a first capacitor electrically connected to the first gate electrode of the driving element and to which the data voltage of pixel data is applied; and
a second capacitor electrically connected to the third node and to which the initialization voltage is applied.

15. A pixel circuit comprising:
a driving element including:
a first electrode electrically connected to a first node;
a first gate electrode electrically connected to a second node;
a second electrode electrically connected to a third node; and
a second gate electrode to which an initialization voltage is applied;
a light emitting element including:
an anode electrode electrically connected to a fourth node; and
a cathode electrode to which a power supply voltage is applied, the light emitting element, in operation, being driven according to a current from the driving element;
a first switch element electrically connected between the first node and the second node;
a second switch element electrically connected in series between the third node and the fourth node;
a third switch element including a first electrode to which the initialization voltage is applied, a second electrode electrically connected to a fifth node, and a gate electrode to which a second scan pulse is applied;
a fourth switch element including a first electrode to which a data voltage is applied, a second electrode connected to the fifth node, and a gate electrode to which a first scan pulse is applied;
a first capacitor electrically connected to the first gate electrode of the driving element and to which a data voltage of pixel data is applied; and
a second capacitor electrically connected to the third node and to which the initialization voltage is applied.

* * * * *